United States Patent [19]
Capasso et al.

[11] Patent Number: 5,502,787
[45] Date of Patent: Mar. 26, 1996

[54] ARTICLE COMPRISING A SEMICONDUCTOR WAVEGUIDE STRUCTURE

[75] Inventors: Federico Capasso, Westfield; Alfred Y. Cho, Summit; Jerome Faist, Scotch Plains; Albert L. Hutchinson, Piscataway; Carlo Sirtori, Summit; Deborah L. Sivco, Warren, all of N.J.

[73] Assignee: AT&T Corp., Murray Hill, N.J.

[21] Appl. No.: 445,821

[22] Filed: May 22, 1995

[51] Int. Cl.$^6$ .............................. G02B 6/02; G02B 6/16
[52] U.S. Cl. ............................................ 385/123; 372/48
[58] Field of Search .................... 385/122, 123, 385/126, 129, 130, 141, 146, 147; 372/45, 46, 50, 48, 22; 359/326, 332; 257/12, 13, 431

[56] References Cited

U.S. PATENT DOCUMENTS

| | | | |
|---|---|---|---|
| 4,528,464 | 7/1985 | Chemla et al. | 372/50 |
| 5,204,871 | 4/1993 | Larkins | 372/45 |
| 5,349,599 | 9/1994 | Larkins | 372/50 |
| 5,399,664 | 3/1995 | Peng et al. | 528/353 |
| 5,434,700 | 7/1995 | Yoo | 385/122 |

OTHER PUBLICATIONS

"Vertical Transition Quantum Cascade Laser with Bragg Confined Excited State", by J. Faist et al., *Applied Physics Letters*, vol. 66(5), 30 Jan. 1995, pp. 538–540.
"Handbook of Optical Constants of Solids", edited by E. D. Palik, Academic Press, Inc. 1985, pp. 169–188. (No Month).
"Mid–Infrared Phase Modulation via Stark Effect on Inter-subband Transitions in GaAs/GaAlAs Quantum Wells", by E. B. Dupont et al., *IEEE Journal of Quantum Electronics*, vol. 29, No. 8, Aug. 1993, pp. 2313–2318.

*Primary Examiner*—Akm E. Ullah
*Attorney, Agent, or Firm*—Eugen E. Pacher

[57] ABSTRACT

Articles according to the invention include a semiconductor waveguide having a core and a cladding, with the cladding including doped semiconductor material. The doping level is selected such that both the real part n and the imaginary part k of the complex refractive index of the doped material are relatively low, exemplarily $n<0.5\ \epsilon_\infty^{1/2}$ and $k<1$, where $\epsilon_\infty$ is the high frequency lattice dielectric constant of the material. Appropriate choice of the doping level can result in improved confinement of the guided radiation without undue increase in the attenuation of the guided radiation. The invention exemplarily is embodied in a long wavelength (~8.5 μm) quantum cascade laser. Other embodiments are contemplated.

8 Claims, 2 Drawing Sheets

ARTICLE COMPRISING A SEMICONDUCTOR WAVEGUIDE STRUCTURE

FIELD OF THE INVENTION

This invention pertains to a semiconductor waveguide structure, and to articles (e.g., semiconductor lasers or modulators) that comprise the waveguide structure.

BACKGROUND OF THE INVENTION

Semiconductor waveguide structures are well known. For instance, semiconductor lasers typically are designed to comprise a waveguide structure that confines the radiation in the direction normal to the plane of the layers. Such a structure generally comprises a first and a second cladding region, with a core region between the cladding regions. The layer structure of the laser is selected such that the refractive index of the core region is greater than the refractive indices of the first and second cladding regions, respectively. The refractive indices of the first and second cladding regions need not be the same.

Semiconductor waveguide structures can readily be designed and made for conventional III/V devices. Such devices typically have operating wavelengths $\leq 2$ μm. Recently a novel device, the quantum cascade (QC) laser, was disclosed. See, for instance, J. Faist et al., *Applied Physics Letters*, Vol. 66(5), p. 538 (1995). See also U.S. patent application Ser. No. 08/223,341. The QC laser will generally be implemented in III/V technology and can be designed to emit radiation of wavelength substantially longer than that emitted by conventional III/V lasers. For instance, the above cited paper describes a QC laser that operated at about 4.5 μm. In principle, QC lasers can operate at even larger wavelengths. However, our initial attempts to design a QC laser that emits radiation of wavelength $\geq 5$ μm revealed the existence of a problem that was, to the best of our knowledge, not previously encountered.

As can be seen from Table I of the above referenced U.S. patent application, an exemplary 4.2 μm QC laser had an upper cladding region consisting of a 1 μm thick n-doped ($1.5 \times 10^{17}/cm^3$) AlInAs layer and a 1.5 μm n-doped ($5 \times 10^{17}/cm^3$) further AlInAs layer, with the total layer structure being of approximate thickness 5 μm. Deposition of such a relatively thick layer structure by MBE (or other deposition methods, e.g., CBE, that may be suitable for making a precision layer structure such as is required for QC lasers) is time consuming.

As will be readily understood by those skilled in the art, the required thickness of the cladding layer of a semiconductor waveguide structure generally increases with increasing wavelength. It will also be understood that the presence of a metal contact layer on a cladding layer imposes stringent limits on the permitted strength of the optical field at the metal/semiconductor interface, if losses of the optical field are to be kept to an acceptable level. These considerations point to an impractically large upper cladding layer thickness in QC lasers that emit at wavelengths $\geq 5$ μm.

We have invented a novel waveguiding structure that is suitable for use in long wavelength (typically $\geq 5$ μm) QC lasers, and that can also be advantageously used in other long-wavelength devices that comprise a semiconductor waveguide structure, e.g., in an optical modulator. As will be explained below, the novel structure utilizes an effect that was, to the best of our knowledge, not previously relied on in waveguide structures. Use of the effect makes possible structures that have a substantially thinner cladding layer than would be necessary in prior art technology.

DEFINITIONS AND GLOSSARY

The "plasma frequency" $\omega_p$ of a doped semiconductor region is a natural mode of oscillation of the carrier "gas" (typically electron gas) in the doped semiconductor. The mode is generally referred to as a plasma mode, or plasmon. Excitation of the plasma mode is associated with a singularity in the free carrier contribution to the dielectric constant of the material. Since the plasma frequency of a semiconductor material is a function of the concentration of free charge carriers (typically electrons) in the material, the optical properties of the material depend on the doping level of the semiconductor material. The plasma frequency $\omega_p = Ne^2/\epsilon_o m$, where N, e, $\epsilon_o$ and m are, respectively, the free carrier concentration (i.e., the doping level), the electron charge, the vacuum permittivity, and the free carrier effective mass, all in MKS units.

For more detail see, for instance, "Handbook of Optical Constants of Solids", E. D. Palik, editor, Academic Press, 1985, especially Ch. 9, incorporated herein by reference.

SUMMARY OF THE INVENTION

The invention is embodied in an article (e.g., a QC laser or a semiconductor waveguide modulator) that comprises a novel waveguide structure for radiation of (vacuum) wavelength $\lambda$ (equivalently, of radial frequency $\omega$), where $\lambda$ typically is about 5 μm or longer. The waveguide structure comprises a core region and a cladding region that has refractive index that is less than the refractive index of the core region.

Significantly, the cladding region comprises doped semiconductor material having a dopant concentration N and a plasma radial frequency $\omega_p$, with N selected such that, for radiation of wavelength $\lambda$, the doped semiconductor material has a refractive index that has a real part $n < 0.5 \epsilon_\infty^{1/2}$ and an imaginary part $k < 1$.

As a result of the appropriate choice of doping level of the semiconductor material the real part of the complex refractive index of the material can be substantially reduced below levels associated with undoped or moderately doped material of the same composition, without undue increase in the imaginary part of the refractive index, and thus without undue increase in the absorption of the radiation in the waveguide. The cladding of waveguides according to the invention comprises relatively highly doped material, exemplarily with dopant concentration $N > 10^{18}/cm^3$ or even $\geq 5 \times 10^{18}/cm^3$, substantially higher than concentrations typically used in prior art waveguides.

The invention can be embodied in any semiconductor material, including in Si and Si-based semiconductors such as $Si_xGe_{1-x}$.

It will be understood that, in order to be effective, the doped semiconductor material has to be positioned in the optically active part of the cladding.

DETAILED DESCRIPTION

Table I shows the layer structure of a QC laser designed to emit radiation of 8.4 μm wavelength. The structure of Tables I and II is lattice matched to InP. This condition determines the layer compositions, as is known to those skilled in the art.

TABLE I

| | | | | |
|---|---|---|---|---|
| $n^{++}$ | GaInAs | $n = 7 \times 10^{18}$cm$^{-3}$ | 600 nm | upper cladding |
| n | AlGaInAs Graded | $5 \times 10^{17}$ | 30 | |
| n | AlInAs | $5 \times 10^{17}$ | 20 | |
| n | AlInAs | $3 \times 10^{17}$ | 1200 | |
| n | AlInAs | $1.2 \times 10^{17}$ | 1200 | |
| n | AlInAs | $1 \times 10^{18}$ | 10 | |
| n | AlGaInAs Graded | $2 \times 10^{17}$ | 40 | core |
| n | GaInAs | $6 \times 10^{16}$ | 500 | |
| n | Injector | $1.5 \times 10^{17}$ | 19.6 | 25x |
| undoped | Active region | | 27.3 | |
| n | GaInAs | $6 \times 10^{16}$ | 700 | |
| n | AlGaInAs Digitally graded | $1.2 \times 10^{17}$ | 25 | |
| | n InP substrate | $4 \times 10^{17}$ | | lower cladding |

TABLE II

| Injector Structure | | | |
|---|---|---|---|
| i | GaInAs | | 4.8 nm |
| i | AlInAs | | 0.5 |
| n | GaInAs | $n = 1.5 \times 10^{17}$ cm$^{-3}$ | 4.2 |
| n | AlInAs | $1.5 \times 10^{17}$ cm$^{-3}$ | 0.8 |
| n | GaInAs | $1.5 \times 10^{17}$ cm$^{-3}$ | 4.0 |
| n | AlInAs | $1.5 \times 10^{17}$ cm$^{-3}$ | 1.0 |
| i | GaInAs | | 4.3 |

Figure 1:
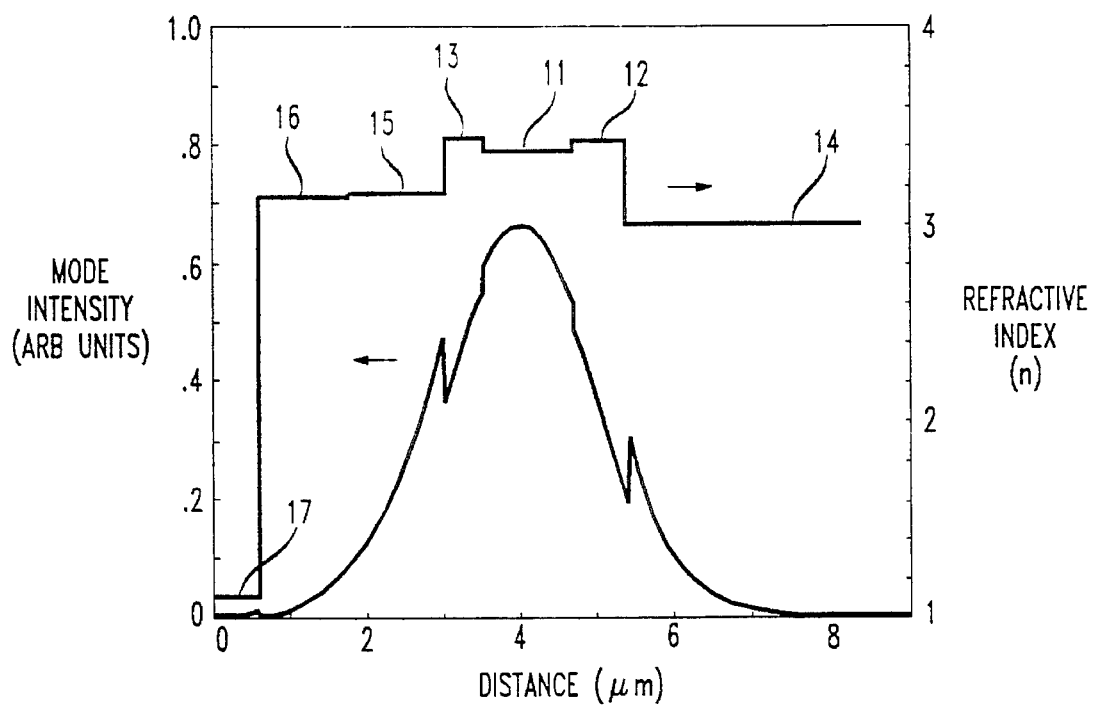
FIG. 1 shows refractive index and mode intensity in an exemplary 8.4 μm QC laser with waveguide structure according to the invention.

The "injector" layer of Table I consists of 4 coupled quantum wells which form a pseudo-quaternary alloy simulating a graded gap (see Table II), and the "active region" consists of three GaInAs quantum wells (thickness 5.8, 7.5 and 3.5 nm, respectively), separated by 2 nm thick AlInAs barriers. The 25 injectors/active regions correspond to central core region 11 of the refractive index profile of FIG. 1, the 700 nm GaInAs layer and the 25 nm InAlGaAs graded layer between the InP substrate and the central core region correspond to outer core region 12, and the 500 nm GaInAs layer and 40 nm graded AlGaInAs layer between the central core region and the upper cladding region correspond to outer core region 13. The n InP substrate provides lower cladding region 14. In the exemplary QC laser under discussion, the upper cladding layer consists of 6 layers, of which 5 are conventionally doped and correspond to regions 15 and 16 of the refractive index profile of FIG. 1. The sixth layer (600 nm thick GaInAs, $7 \times 10^{18}$/cm$^3$) however is not conventional, and is a significant feature of the inventive structure, with the dopant concentration N of layer 17 selected to result in the desired complex refractive index. An exemplary procedure for determining the appropriate value of N will now be described.

The real and imaginary parts of the complex dielectric constant can be written respectively as follows:

1) $\epsilon_1 = \epsilon_\infty - \omega_p^2/\omega^2 = \epsilon_\infty - (e^2/\epsilon_o m \omega^2)N$; and 2) $\epsilon_2 = (\omega_p^2/\omega^2)(1)/\omega\tau = (e^2/\epsilon_o m \omega^2)(1/\omega\tau)N$.

In these expressions, $\epsilon_\infty$ is the high-frequency lattice dielectric constant (essentially corresponding to the dielectric constant of undoper semiconductor material of the relevant composition for infrared radiation), and $\tau$ is the electron scattering time. The other quantities are as defined above.

For purposes of this example, we assume that the waveguide is to operate at $\lambda=8.5$ μm, corresponding to $\omega=2.2 \times 10^{14}$ radian/s. Furthermore, $\tau$ is 0.1 ps (yielding $1/\omega\tau=4.5 \times 10^{-2}$), $\epsilon_\infty=11.8$ (corresponding to n=3.43 in the undoped material). The effective mass is 0.0427 $m_o$, where $m_o = 9.1 \times 10^{-31}$ kg. The above values are appropriate for the GaInAs of layer 17, and yield the following expressions from equations 1 and 2:

1') $\epsilon_1 = 11.8 - 1.54N$; and

2') $\epsilon_2 = 7 \times 10^{-2}N$, where N is the dopant concentration in units of $10^{24}$/m$^3$.

The real and imaginary part of the refractive index can be written respectively as follows:

$$3) \, n = \left[ \frac{(\epsilon_1^2 + \epsilon_2^2)^{1/2}}{2} + \frac{\epsilon_1}{2} \right]^{1/2}$$

$$4) \, k = \left[ \frac{(\epsilon_1^2 + \epsilon_2^2)^{1/2}}{2} - \frac{\epsilon_1}{2} \right]^{1/2}$$

Using equations 3 and 4, one can readily determine the value of N that will result in appropriate values of n and k. Typically N will be chosen such that both n and k are small, e.g., $n < 0.5 \, \epsilon_\infty^{1/2}$, $k < 1$.

Figure 2:
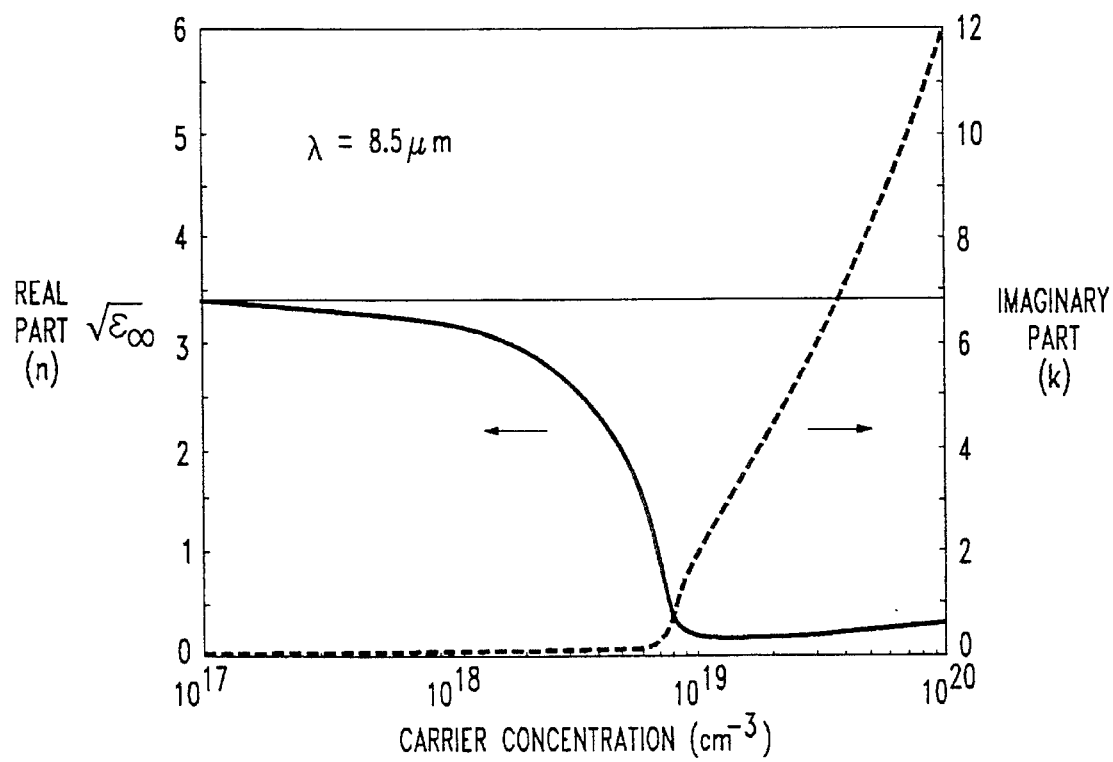
FIG. 2 shows exemplary curves of real and imaginary part of the dielectric constant as a function of doping level.

FIG. 2 shows n and k as a function of doping concentration, for $\lambda = 8.5$ μm, in semiconductor material of the composition of layer 17. As can be seen from FIG. 2, there exists a range of doping concentration in which both n and k are small, e.g., below $0.5 \, \epsilon_\infty^{1/2}$ and 1, respectively. Preferably, $n < 0.25 \, \epsilon_\infty^{1/2}$ and $k < 0.5$.

The presence of the low refractive index $n^{++}$ layer results in a lowered refractive index of the top cladding layer and in increased confinement of the fundamental mode, as compared to a conventional waveguide. By way of example, our calculations show that the structure of Table I has a confinement factor $\Gamma=0.41$, with the mode refractive index being 3.25, and the waveguide loss $\alpha_\omega=7.8$ cm$^{-1}$. They also show that an otherwise identical comparison structure without the $n^{++}$ layer (with the $5 \times 10^{17}$/cm$^3$ AlInAs extended to yield the same cladding layer thickness) has significantly increased loss ($\alpha_\omega=13$ cm$^{-1}$) and reduced confinement factor ($\Gamma=0.37$). Clearly, the heavily doped cladding layer typically will be necessary in order to avoid prohibitively thick conventional cladding layers for low loss.

Those skilled in the art will recognize that the highly doped cladding layer according to the invention need not necessarily be the cladding layer that is most remote from the core. However, placement as shown in Table I is preferred because it results in relatively low loss.

The multilayer semiconductor structure of Table I was grown on a InP substrate by MBE, and processed into mesa-etched 22 μm wide waveguides by conventional wet chemical etching. This was followed by growth of a 200 nm thick $Si_3N_4$ layer to provide insulation between the contact pads and the doped InP substrate. Windows were defined through the $Si_3N_4$ by plasma etching, thereby exposing the mesa tops. Ti/Au non-alloyed ohmic contacts were then formed on the mesa tops, followed by cleaving of the processed wafer into bars of different length. Cleaved bars were then soldered with In to a copper holder, wire bonded and tested in a He flow cryostat.

Figure 3:
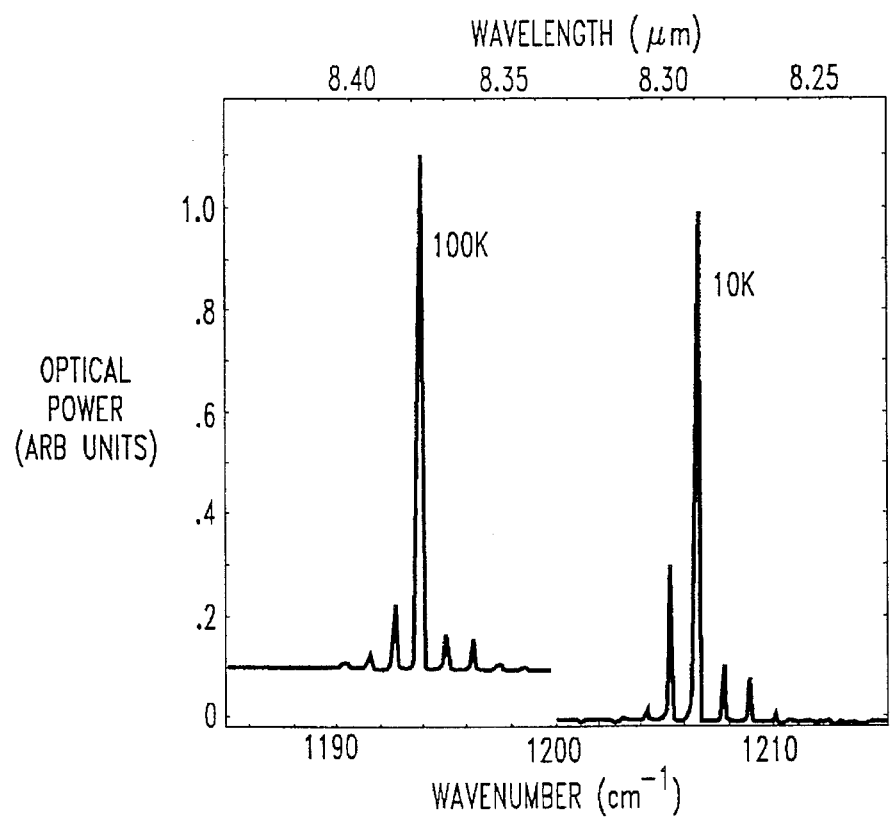
FIG. 3 shows the spectrum of the QC laser of FIG. 1 at two heat sink temperatures.

FIG. 3 shows an exemplary high resolution spectrum of one of the above described QC lasers, taken in rapid scan with a Fourier transform interferometer. Peak optical powers of the lasers ranged from about 50 mW at 10 K to about 10 mW at the highest heat-sink temperature (130 K). Average slope efficiency was about 0.1 W/A at 100 K.

Those skilled in the art will appreciate that long wavelength QC lasers are not the only possible embodiments of the invention. Indeed, the invention can be usefully embodied in any device that comprises a semiconductor (not necessarily III/V semiconductor) waveguide for relatively long wavelength (typically ≧5 μm) radiation, especially for such devices that comprise a metal layer in close proximity to the waveguide (e.g., the metal layer is disposed on the cladding region). Exemplary of such devices is a semiconductor modulator of the type described in E. B. Dupont et al., *IEEE J. of Quantum Electronics*, Vol. 29, p. 2313 (1993).

Figure 4:
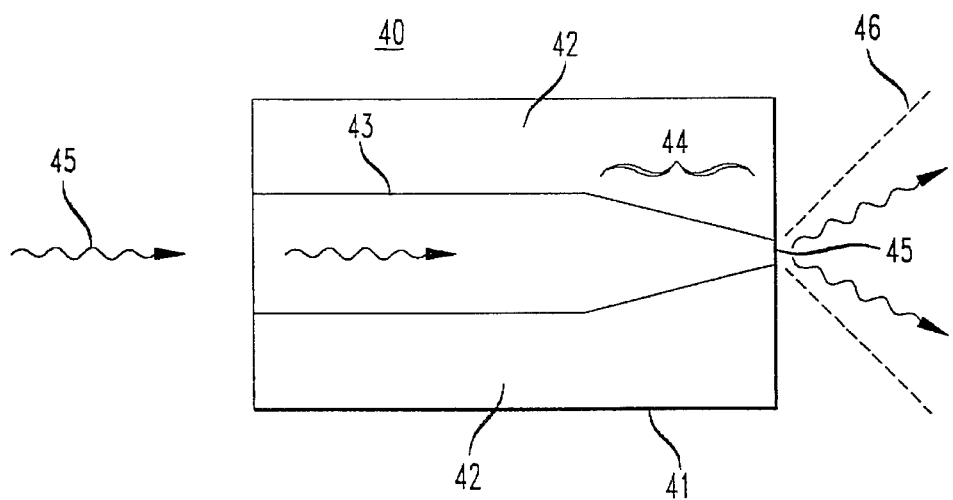
FIG. 4 schematically depicts a further embodiment of the invention.

Another possible embodiment of the invention is a tapered core semiconductor waveguide (typically, but not necessarily a planar waveguide) for, e.g., radiation from a $CO_2$ laser. Such a structure could be used to concentrate the radiation into a very small (~1 μm) region at the core/air interface, with the beam being highly divergent in air. As a consequence of the divergence of the beam, the power density in the beam is highly position-dependent, with very high power density existing close to the core/air interface, but with relatively low power density elsewhere. Apparatus comprising such a tapered waveguide is useful for controlled material modification, including surgery. FIG. 4 schematically shows in top view an exemplary structure 40 as described above, with numeral 41 referring to a semiconductor (e.g., Si) body that comprises a planar waveguide with lateral confinement of the radiation obtained by appropriate doping of regions 42, substantially as described above. Numeral 43 refers to the core of the waveguide, and 44 refers to the tapered section of the core. The guided radiation exits from the guide at 45, forming a highly divergent beam that can have very high power density close to 45.

The invention claimed is:

1. An article comprising a semiconductor structure comprising a waveguide for radiation of vacuum wavelength λ, said waveguide comprising a core region and a cladding region having a refractive index that is less than a refractive index of the core region;

CHARACTERIZED IN THAT said cladding region comprises doped semiconductor material having a dopant concentration N and a plasma radial frequency $\omega_p$, with N selected such that the doped semiconductor material has a complex refractive index that has a real part n $<0.5\ \epsilon_\infty^{1/2}$ and an imaginary part k<1, where $\epsilon_\infty$ is the high-frequency lattice dielectric constant of the semiconductor material.

2. Article according to claim 1, wherein said doped semiconductor material is doped n-type, with N selected such that n<0.25 $\epsilon_\infty^{1/2}$ and k<1.

3. Article according to claim 1, wherein λ>5 μm.

4. Article according to claim 1, wherein said doped semiconductor material is III/V semiconductor material.

5. Article according to claim 4, wherein the article is a semiconductor laser.

6. Article according to claim 1, wherein said doped semiconductor material comprises Si.

7. Article according to claim 6, wherein the article comprises a planar waveguide laterally defined by said doped semiconductor material and comprising a tapered core section that terminates at a core/air interface.

8. Article according to claim 1, wherein $N>1\times10^{18}/cm^3$.

\* \* \* \* \*